United States Patent [19]
Gerber et al.

[11] Patent Number: 5,880,600
[45] Date of Patent: Mar. 9, 1999

[54] DEVICE FOR INTERFACING LOGIC SIGNALS FROM THE LLL LEVEL TO THE TTL AND CMOS LEVEL

[75] Inventors: Rémi Gerber; Janick Silloray, both of Nantes, France

[73] Assignee: Matra MHS, Nantes, France

[21] Appl. No.: 533,400

[22] Filed: Sep. 25, 1995

[30] Foreign Application Priority Data

Sep. 26, 1994 [FR] France .................................. 94 11436

[51] Int. Cl.⁶ .............................................. H03K 19/0185
[52] U.S. Cl. ................................ 326/68; 326/73; 326/74; 326/81
[58] Field of Search ........................... 326/63, 68, 73–74, 326/80–81

[56] References Cited

U.S. PATENT DOCUMENTS

| | | |
|---|---|---|
| 4,779,015 | 10/1988 | Erdelyi ................................. 326/23 X |
| 5,115,434 | 5/1992 | Aizaki . |
| 5,311,083 | 5/1994 | Wanlass ................................ 326/81 X |
| 5,332,935 | 7/1994 | Shyu ..................................... 326/73 X |
| 5,361,006 | 11/1994 | Cooperman et al. ..................... 326/73 |
| 5,453,704 | 9/1995 | Kawashima .............................. 326/81 |
| 5,455,526 | 10/1995 | Runas ...................................... 326/81 |

OTHER PUBLICATIONS

1992 Symposium on VLSI Circuits, Digest of Technical Papers, Jun. 4–6, 1992, Seattle, pp. 82–83, Y. Nakagome et al. "Sub–IV Swing Bus Architecture for Future Low–Power ULSIs".

*Primary Examiner*—David R. Hudspeth
*Attorney, Agent, or Firm*—Larson & Taylor

[57] ABSTRACT

A device for interfacing from the LLL level to the TTL and CMOS level that comprises, in cascade, a first and a second amplifier-inverter and a shaping circuit delivering an inverted logic signal at the TTL level. A power inverter-amplifier circuit receives the inverted logic signal at the TTL level and delivers an amplified logic signal at the TTL level.

8 Claims, 2 Drawing Sheets

5,880,600

DEVICE FOR INTERFACING LOGIC SIGNALS FROM THE LLL LEVEL TO THE TTL AND CMOS LEVEL

BACKGROUND OF THE INVENTION

The invention relates to a device for interfacing logic signals from the LLL level to the TTL and CMOS level.

DESCRIPTION OF THE RELATED ART

In present-day integrated circuits, particularly logic circuits, it is vital to allow switching from a logic low level to a logic high level, or vice-versa, in a reduced switching amplitude range.

For this reason, logic circuits with a low power supply voltage, known as LLL circuits, have been developed, these circuits allowing switching between a 1.1 volt logic low level and a 1.9 volt high level.

This type of circuit perfectly satisfies the criteria of low electrical energy consumption, both in the standby state and in switching.

However, the advent of this type of circuit poses the problem of its incompatibility with conventional logic circuits such as TTL (Transistor Transistor Logic) and CMOS circuits, for which the logic low and high levels are less than 1.0 volt and substantially equal to 5 volts respectively. The problem of compatibility posed concerns not only the values of the power supply voltages for the circuit, which make it possible to generate the voltage values corresponding to the logic high level, but particularly the continuity of the transmission of logic information, by reason of the risk of ambiguity between the logic high level of the LLL level and the logic low level of the TTL and CMOS level.

One solution to the abovementioned problem may consist in generating a common threshold voltage, intermediate between the LLL logic high level and the TTL and CMOS logic low level, and in discriminating these logic levels with respect to it.

This solution gives satisfaction, but it exhibits the following drawbacks:

the presence of an added structure making it possible to generate the common threshold voltage and, if appropriate, to discriminate the abovementioned logic levels;

the consumption of a sizeable surface area in the case of the integration of this added structure in the form of an integrated circuit, and the corresponding consumption of silicon.

SUMMARY OF THE INVENTION

The object of the present invention is to remedy the abovementioned drawbacks by implementing a device for interfacing LLL logic signals to the TTL and CMOS level, in which any common threshold voltage is dispensed with.

A further subject of the present invention is also the implementation of a device for interfacing LLL logic signals to the TTL and CMOS level, in which the continuity of the transmission of the logic information between the two types of circuit is ensured by virtue of the use of progressive and compatible amplitude transitions between voltage values of the logic low and high levels.

The device for interfacing logic signals from the LLL level to the TTL and CMOS level, the subject of the present invention, is noteworthy in that it comprises, fed by a power supply voltage at the TTL level with respect to a reference voltage and connected in cascade, a first amplifier-inverter receiving the logic signal at the LLL level on one input, and delivering a first inverted logic signal, of intermediate amplitude, a second amplifier-inverter receiving the first inverted logic signal of intermediate amplitude and delivering a second logic signal of amplified intermediate amplitude, a shaping circuit receiving the second logic signal of amplified intermediate amplitude and delivering an inverted logic signal at the TTL level; a power inverter-amplifier circuit receives the inverted logic signal at the TTL level and delivers an amplified logic signal at the TTL level.

The device for interfacing logic signals from the LLL level to the TTL and CMOS level, the subject of the present invention, finds an application in the integrated-circuit industry.

BRIEF DESCRIPTION OF THE DRAWINGS

It will be better understood on reading the description and on perusing the drawings below, in which.

DETAILED DESCRIPTION OF THE PREFERRED EMBODIMENTS

A more detailed description of the logic signal interfacing device, the subject of the present invention, will now be given in connection with FIG. 1 and then FIG. 2.

Figure 1:
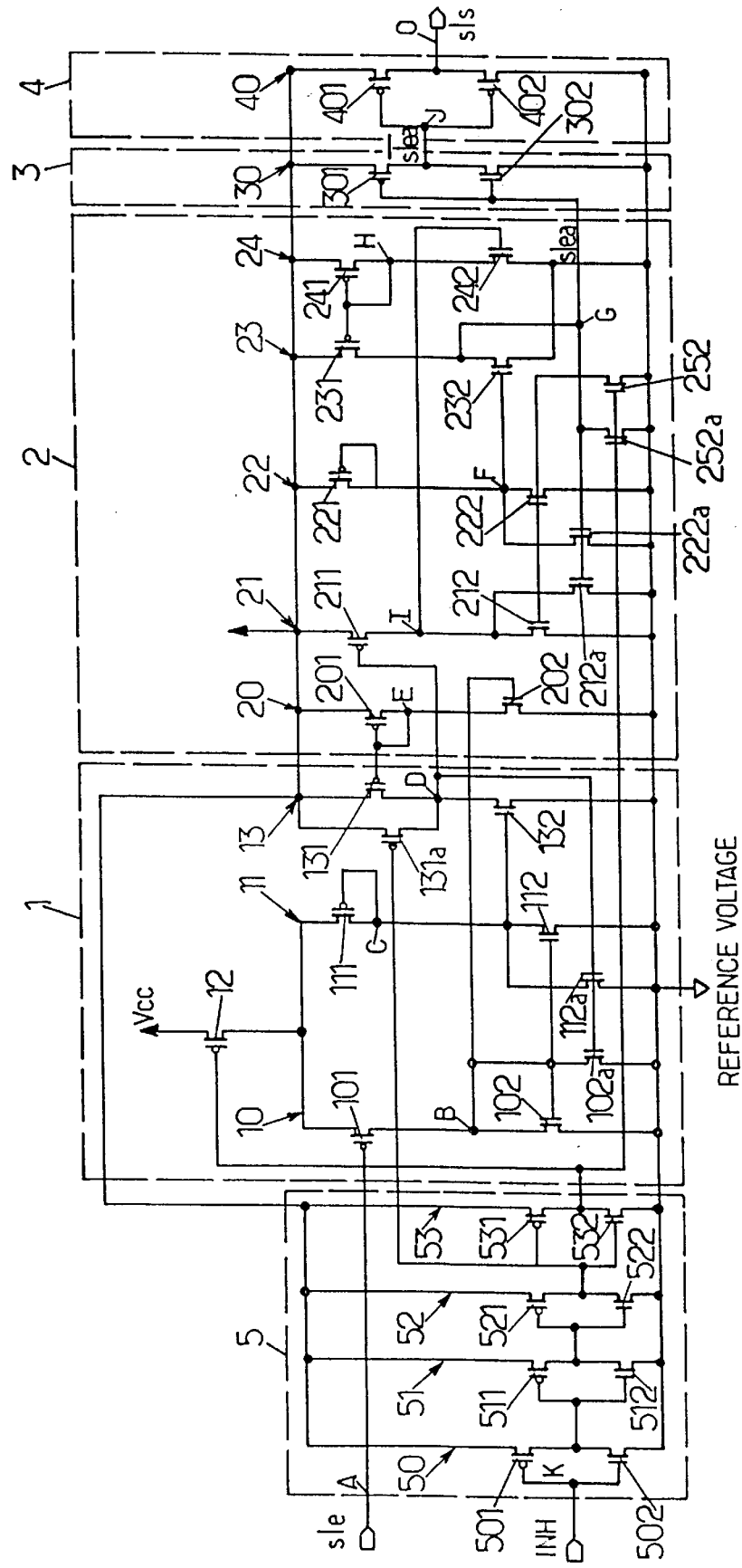
FIG. 1 represents a block and implementation diagram of the logic signal interfacing device, the subject of the present invention.
Figure 2A:
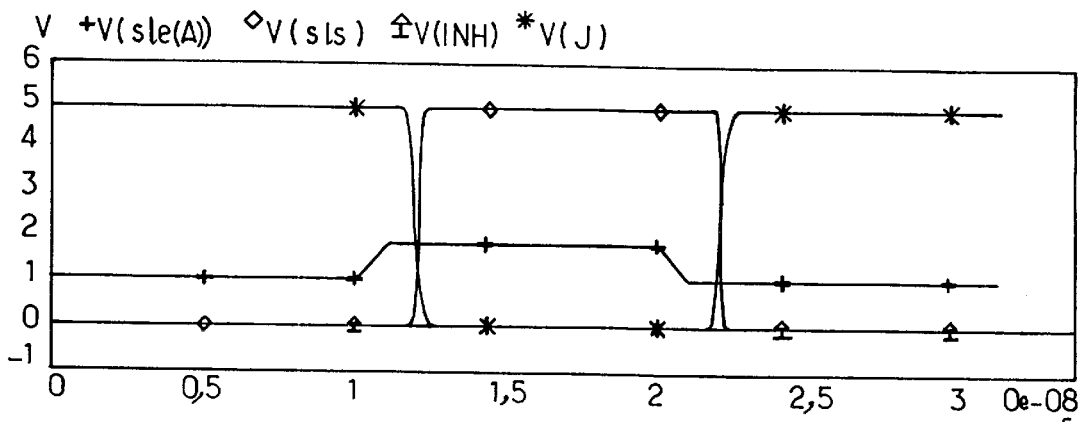
FIG. 2 represents a timing diagram of signals picked up at significant test points of the device represented in FIG. 1.
Figure 2B:
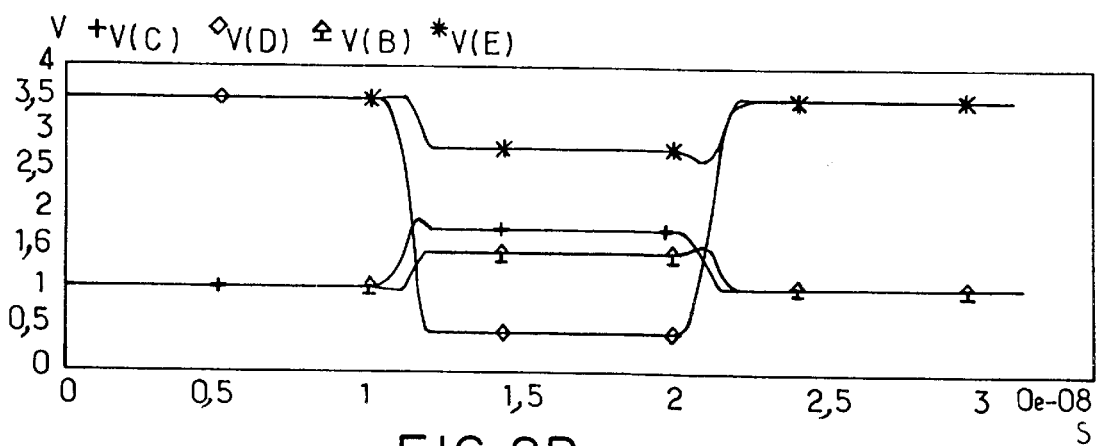
Figure 2C:
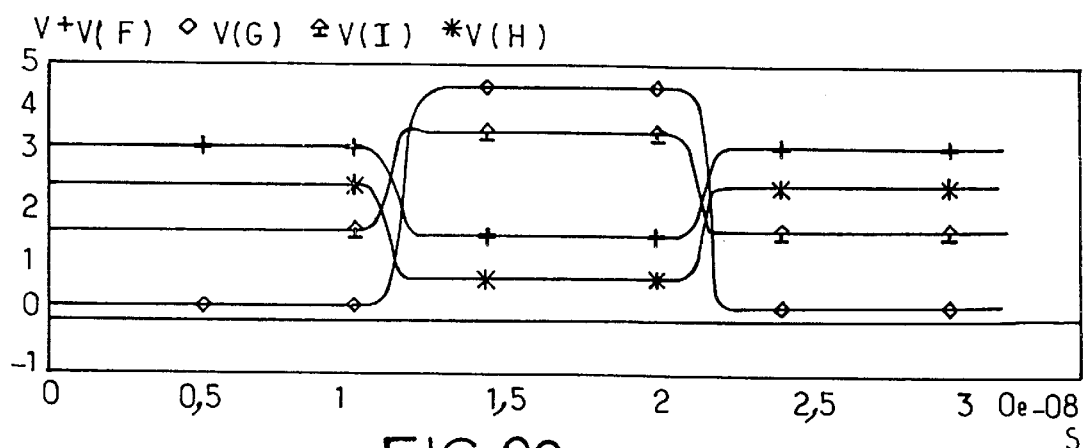

As has been represented in FIG. 1, the device for interfacing logic signals from the LLL level to the TTL and CMOS level, the subject of the present invention, comprises, fed with a power supply voltage VCC at the TTL level with respect to a reference voltage or earth voltage, and connected in cascade, a first amplifier-inverter 1, which receives an input logic signal, denoted sle, at the LLL level on an input corresponding to a test point A, and delivering a first inverted logic signal of intermediate amplitude, denoted $\overline{\text{sle}}$. The first inverted logic signal $\overline{\text{sle}}$ of intermediate amplitude is delivered to test point D of FIG. 1.

Moreover, the interfacing device according to the invention comprises a second amplifier-inverter 2, which receives the first inverted logic signal $\overline{\text{sle}}$ of intermediate amplitude, and delivers a second logic signal of amplified intermediate amplitude, denoted slea. The second logic signal of amplified intermediate amplitude, denoted slea, is, more particularly, delivered to test point G of FIG. 1.

The interfacing device, the subject of the present invention, also includes, connected in cascade with the second amplifier-inverter 2, a shaping circuit 3 receiving the second logic signal of amplified intermediate amplitude slea and delivering an inverted logic signal at the TTL level, denoted $\overline{\text{slea}}$ in the abovementioned FIG. 1. This signal, more particularly, is delivered to test point J of FIG. 1.

A power inverter-amplifier circuit 4 is finally provided, connected in cascade to the shaping circuit 3 and receiving the inverted logic signal at the TTL level, $\overline{\text{slea}}$, and delivering an amplified logic signal at the TTL level, the output signal sls of the interfacing device, the subject of the present invention. The amplified logic signal at the TTL level, sls, is more particularly delivered to test point O in FIG. 1.

Moreover, in a non-limiting way, the device for interfacing logic signals from the LLL level to the TTL and CMOS level, the subject of the present invention, may comprise a control circuit 5 receiving a control signal making it possible to reduce the static electrical energy consumption in standby mode, this control signal being denoted INH and being input at test point K of the abovementioned FIG. 1.

A more detailed description of the set of various modules constituting the logic signal interfacing device, the subject of the present invention, will now also be given in connection with FIG. 1.

As represented in the abovementioned figure, the first amplifier-inverter 1 comprises, for example, a first inverter stage, denoted 10, formed by two P, N MOS transistors bearing the references 101 and 102 and connected in cascade. The gate of the P MOS transistor 101 forms the input port of the interfacing device and receives the logic signal at the LLL level, that is to say the input logic signal sle at test point A of FIG. 1. A second inverter stage 11 is provided, which is formed by two P, N MOS transistors, denoted 111, 112, these transistors 111, 112 being connected in cascade. The first 10 and the second 11 inverter stage are connected in parallel between the reference voltage, earth voltage, and a common point to which the source electrode of the MOS transistors 101 and 111 is connected. Moreover, a P MOS power transistor, denoted 12, is interconnected between the power supply voltage VCC and the common point between the first 10 and the second 11 inverter previously mentioned.

Moreover, a third inverter stage 13 is provided, which is formed by two P, N MOS transistors referenced 131, 132 and connected in cascade between the power supply voltage VCC and the reference voltage or earth voltage. The common point between the P, N MOS transistors 131 and 132 of the third inverter stage 13 forms the output terminal of the first amplifier-inverter 1 at test point D of FIG. 1. This output terminal delivers the first inverted logic signal of intermediate amplitude, denoted $\overline{sle}$.

As is apparent furthermore in FIG. 1, with regard to the first amplifier-inverter 1, a feedback circuit is formed by a first 102a and a second 112a feedback N MOS transistor, which are each connected in parallel with the N MOS transistor 102, 112 of the first and of the second inverter stage 10, 11 respectively. The gate of the feedback transistors 102a, 112a is connected at the output of the first amplifier-inverter, that is to say at test point D of FIG. 1.

As far as the second amplifier-inverter 2 is concerned, as represented in FIG. 1, it comprises a first 20, a second 21, a third 22, a fourth 23 and a fifth 24 inverter stage, each formed by two P, N MOS transistors bearing the references 201, 202; 211, 212; 221, 222; 231, 232; 241, 242, the abovementioned pairs of MOS transistors being connected in cascade. These inverter stages are connected in parallel between the power supply voltage VCC and the reference voltage, earth voltage. The gate of the P MOS transistor 201 of the first inverter stage 20 is connected to the common point of the P and N MOS transistors 201, 202 of the first inverter stage 20 and the gate of the N MOS transistor 202 of this same first inverter stage is connected to the common point of the first inverter stage 10 of the first amplifier-inverter 1, that is to say to test point B of FIG. 1. The output of the first amplifier-inverter 1, that is to say test point D of FIG. 1, is connected to the gate of the P MOS transistor 211 of the second inverter stage 21 to form the interconnection between the output of the first amplifier-inverter 1 and the input of the second amplifier-inverter 2. The common point between the P MOS transistor 211 and the N MOS transistor 212 of the second inverter stage 21 is connected to the gate of the N MOS transistor 232 of the fourth inverter stage 23 and the gate of the P MOS transistors 221; 231; 241 of the third and fourth and fifth inverter stages 22, 23, 24 is interconnected to the common point of the third 22 and of the fifth inverter stage 24 respectively. The common point of the P, N MOS transistors 231, 232 of the fourth inverter stage 23 forms the output of the second amplifier-inverter stage 2 and delivers the second logic signal of amplified intermediate amplitude slea to test point G of FIG. 1.

Moreover, a feedback circuit is provided, which is formed by a first 212a and a second 222a feedback N MOS transistor, which are each connected in parallel with the N MOS transistor 212, 222 of the second 21 and third 22 inverter stage respectively. The gate of the feedback transistors 212a, 222a is connected to the output of the second amplifier-inverter 2.

As far as the shaping circuit 3 is concerned, as it appears in FIG. 1, it comprises an inverter stage 30 formed by two P, N MOS transistors 301, 302 connected in cascade. The gates of the P, N MOS transistors are linked in parallel at the output of the second amplifier-inverter 2, in particular to test point G of FIG. 1, and thus form an input terminal for the abovementioned shaping circuit 3. The common point of the P, N MOS transistors 301, 302 forms an output terminal of the shaping circuit 3 and delivers the inverted logic signal at the TTL level, the $\overline{slea}$ signal, to the power inverter-amplifier circuit 4.

Finally, as for the power inverter-amplifier circuit 4, it comprises an inverter stage formed by two P, N MOS transistors, denoted 401, 402, connected in cascade. The gate of the P, N MOS transistors forms the input terminal of the power inverter-amplifier circuit 4, these gates being connected in parallel at the output of the shaping circuit 3 at test point J of FIG. 1. The common point of the two P, N MOS transistors 401, 402 forms an output terminal of the inverter-amplifier circuit and delivers the amplified logic signal at the TTL level, sls, forming the output logic signal for the device for interfacing logic signals from the LLL level to the TTL and CMOS level, the subject of the invention.

In one advantageous embodiment, it is stated that the device for interfacing logic signals from the LLL level to the TTL and CMOS level, according to the invention, may comprise the control circuit 5 making it possible to reduce the static electrical energy consumption in standby mode, this circuit possibly comprising, for example, as represented in FIG. 1, a first 50, a second 51, a third 52 and fourth 53 inverter stage, each formed by two P, N MOS transistors 501, 502; 511, 512; 521, 522; 531, 532 mounted in cascade, these inverter stages being connected in parallel between the power supply voltage and the reference voltage or earth voltage. The common point of the P, N MOS transistors is connected to the gates of the P, N MOS transistors of the following inverter stage, the common point of the P, N MOS transistors 531, 532 of the fourth and last inverter stage 53 forms the output terminal of the control circuit 5, this output terminal being connected, on the one hand, to the gate of the P MOS power transistor 12 of the first amplifier-inverter 1 and, on the other hand, to the gate of a first 252 and of a second 252a inhibitor N MOS transistor. The first 252 and the second 252a N MOS transistor are connected in parallel between gate and reference voltage, earth voltage, of the feedback transistors 212a of the second amplifier-inverter 2 or between gate and reference voltage of the MOS transistors 212, 222 of the second 21 and of the third 22 inverter stage of the second amplifier-inverter 2, respectively.

The operation of the device for interfacing logic signals from the LLL level to the TTL and CMOS level, the subject of the present invention, will now be described in connection with FIGS. 1 and 2.

The first amplifier-inverter 1 is an input amplifier with feedback, this amplifier consisting of a system exhibiting gain and a structure imposing self-compensation so as to ensure the stability of the system. Feedback is provided by the previously mentioned feedback transistors 102a, 112a. This operating mode makes it possible to obtain an overall gain which is lower but constant in terms of frequency and insensitive to variations in the temperature, in the power supply voltage VCC as well as in the manufacturing process.

By way of non-limiting example, the test point A being fixed at the outset, that is to say at the value of the LLL logic low level, i.e. 1.1 volt, upon a transition, that is to say a passage to the logic high level at the value of 1.9 volt, this transition causes lowering of the voltage at test point B and, due to the coupling of the first 10 and of the second inverter stage, the voltage at test point C increases. With the voltage at test point B falling, the voltage at test point E rises in contrast, whereas the voltage at test point D falls very rapidly by reason of the impedance reflected between test point D and the power supply voltage VCC, this impedance increasing greatly due to the fact that test point E in fact acts to reduce the gate-source voltage of transistor 131 so as to bring it closer to the threshold voltage thereof. With the voltage at test point D falling significantly, the voltage at test point B rises in contrast, and the voltage at test point C continues to rise. With the voltage at test points B and C increasing, the voltage at test point E falls slightly and the voltage at test point D continues to fall significantly, this voltage drop at test point D being limited, however, by the lowering of the voltage of test point E due to the reduction in the impedance reflected between test point D and the power supply voltage VCC.

Clearly, it will be understood that as far as an opposite transition of the LLL input logic signal sle is concerned, a lowering of the voltage at test point A, that is to say a transition of the value from the 1.9 volt logic high level to the voltage value of the logic low level, 1.1 volt, the voltages at the abovementioned test points change in the opposite direction.

Although the voltage transition voltage from the logic high level to the logic low level or vice-versa from the logic low level to the logic high level of the LLL input logic signal changes between the 1.9 volt and 1.1 volt values or vice-versa, it is understood that the first inverted logic signal $\overline{sle}$ delivered by the first amplifier-inverter 1 changes in an inverse way between two voltage values, known as intermediate values, which are less than the voltage value of the logic high level and greater than the voltage value of the logic low level of the TTL level respectively. Typically, these values may be 3.5 volts and 0.5 volt.

The second amplifier-inverter 2 is an intermediate amplifier of the same type as that described previously in relation to the first intermediate amplifier 1, but it nevertheless exhibits a different equilibrium point, this equilibrium point lying between the previously mentioned voltage values.

With test point A, for example, being fixed at the outset, that is to say at the value of the LLL logic low level, 1.1 volt, upon a transition to the logic high level at a value of 1.9 volts, the voltage at test point D falls rapidly from the value of the logic high level, 3.5 volts, to the value of the logic low level, 0.5 volt, these values constituting the intermediate logic levels for the second amplifier-inverter 2. By reason of the rapid fall in the voltage at test point D, the voltage at test point I, the common point of the second inverter stage 21, rises in contrast, and the voltage at test point F falls in consequence. With the voltage at test point I rising, the voltage at test point H also falls in consequence, and the gate-source voltage between test point H for P-type MOS transistors 231 and 241 rises, and the impedance seen between test point G and the power supply voltage VCC is greatly reduced. The voltage at test point G then rises, all the more so as the voltage at test point F falls. With this latter voltage at test point F falling, the voltage seem between test point G and the reference or earth voltage increases greatly and further reinforces the rise in voltage at test point G.

In contrast, as far as the reverse transition of voltage rise at test point D from 0.5 volt to 3.5 volts is concerned, it is sufficient to repeat the preceding description, considering that all the voltages at the test points change in the opposite direction to that described previously. In consequence, the amplified input logic signal slea delivered at the output of the second amplifier-inverter 2 varies in the same direction as the input logic signal, but with a higher transition amplitude level, as represented in FIG. 2, between values lying between 0.5 volt for the logic low level and 4.5 volts for the logic high level.

As for the shaping module 3, it has the purpose of converting the voltage variations of test point G, that is to say the previously described amplified input logic signal slea, as delivered by the second amplifier-inverter 2, into voltage variations at the CMOS level. The shaping circuit 3 therefore consists of the CMOS inverter 30, the switchover point of which has been chosen substantially in the middle of the excursion of the voltage at test point G, that is to say at a value of about 2.5 volts.

Finally, as for the power inverter-amplifier circuit 4, this consists of a CMOS-type inverter making it possible to increase the output current upon switching. It thus makes it possible to perform rapid switching with relatively short rise and fall times. Obviously, it receives the signal consisting of the transitions between the CMOS-type logic levels, 5 volts for the logic high level, 0 volt for the logic low level, which are delivered to test point J by the shaping circuit 3, as represented in FIG. 2.

The control circuit 5 making it possible to reduce static electrical energy consumption in standby mode receives a control signal, denoted INH, making it possible not only to cut the static consumption of the first and of the second amplifier stage 1, 2 and thus to stop their operation, but also to generate a CMOS level at the output so as to inhibit the static consumption of any cell connected downstream of the power inverter-amplifier circuit 4, in fact constituting an output stage of the device for interfacing logic signals from the LLL level to the TTL and CMOS level, the subject of the present invention. Transistor 131a cuts off the power supply VCC by virtue of transistors 211, 102a and 112a. Hence, when the inhibition signal INH is at the logic low level, 0 volt, the interfacing device which is the subject of the present invention operates normally, as previously described in connection with FIGS. 1 and 2. In contrast, when the same signal INH is at the logic high level, that is to say at the value of the power supply voltage VCC, the first and the second amplifier-inverter 1, 2 are turned off and consume no electrical energy in static mode. Moreover, test point O of the output, which normally delivers the output signal sls, is at the reference voltage, earth voltage.

Clearly, the device for interfacing logic signals from the LLL level to the TTL and CMOS level, the subject of the present invention, is preferably used in the form of integrated circuits in CMOS technology.

Under these conditions, the first amplifier-inverter circuit 1, the second amplifier-inverter 2, the shaping circuit 3 and the inverter-amplifier circuit 4 are highly insensitive to minor variations in the channel width of the N transistors employed, which makes it possible to envisage all types of applications, particularly in the toughest conditions. In fact, in such cases, it is necessary to position masks in the region of the spikes created in the region of the polysilicon gates changing from thick oxide to thin oxide of the N transistors so as to avoid the drain-source current being bypassed through the outside of the N transistor. Such a measure can be avoided due to the fact that the interfacing device which is the subject of the present invention is in fact equipped with the first and with the second amplifier-inverters 1, 2 mounted in cascade with feedback, the device as a whole thereby remaining perfectly functional.

Moreover, the interfacing device which is the subject of the invention nevertheless keeps the same electrical properties of propagation time and of rise and fall times.

Thus, a device has been described for interfacing logic signals from the LLL level to the TTL and CMOS level, making it possible to provide interfacing between two types of logic circuits having different logic levels, one LLL, the other CMOS.

This implementation is particularly advantageous to the extent that it allows switching between these two types of logic circuits in extremes of variations in voltage, in temperature and in manufacturing method, without, however, requiring introduction of a common threshold voltage. Moreover, the interfacing device according to the invention exhibits a simple structure, for very easy installation and use.

We claim:

1. A device for interfacing logic signals from the LLL, level to the TTL and CMOS level, said device comprising, fed by a power supply voltage at the TTL level with respect to a reference voltage, and connected in series;

a first amplifier-inverter receiving said logic signal at the LLL level on one input and delivering a first inverted logic signal, of intermediate amplitude, a second amplifier-inverter receiving said first inverted logic signal of intermediate amplitude and delivering a second logic signal of amplified intermediate amplitude, a shaping circuit receiving said second logic signal of amplified intermediate amplitude and delivering an inverted logic signal at the TTL level, and a power inverter-amplifier circuit receiving said inverted logic signal at the TTL level and delivering an amplified logic signal at the TTL level, said first and second amplifier-inverters including a control circuit receiving a control signal enabling reduction of static electrical energy consumption in a standby mode.

2. Device according to claim 1, wherein said first amplifier-inverter comprises:

a first inverter stage formed by a P MOS transistor and a N MOS transistor connected in series, the gate of said P MOS transistor forming the input of said interfacing device and receiving said logic signal at the LLL level, a second inverter stage formed by a P MOS transistor and a N MOS transistor connected in series, said first and said second inverter stages being connected in parallel between said reference voltage and a common point, a P MOS power transistor interconnected between said power supply voltage and said common point, a third inverter stage formed by a P MOS transistor and a N MOS transistor connected in series between said power supply voltage and said reference voltage, the common point between the P MOS and transistors of said third inverter stage forming the output terminal of said first amplifier-inverter and delivering said first inverted logic signal of intermediate amplitude, and a feedback circuit formed by first and second feedback N MOS transistors each connected in parallel with the N MOS transistor of the first and second inverter stages, respectively, the gates of said feedback transistors being connected at the output of said first amplifier-inverter.

3. Device according to claim 1, wherein said second amplifier-inverter comprises:

first, second, third, fourth and fifth inverter stages, each formed by a P MOS transistor and a N MOS transistor connected in series, said inverter stages being connected in parallel between said power supply voltage and said reference voltage, the gate of the P MOS transistor of the first inverter stage being connected to the common point of the P MOS and N MOS transistors of said first inverter stage and the gate of the N MOS transistor of said first inverter stage being connected to the common point of said first inverter stage of said first amplifier-inverter, and the output of the said first amplifier-inverter being connected to the gate of the P MOS transistor of said second inverter stage, to from the interconnection between the output of said first amplifier-inverter and the input of said second amplifier-inverter, the common point between the P MOS transistor and the N MOS transistor of said second inverter stage being connected to the gate of the N MOS transistor of said fourth inverter stage, and the gate of the P MOS transistors of said third and fourth and fifth inverter stages being interconnected to the common point of said third inverter and of said fifth inverter stage, respectively, the common point of the P MOS and N MOS transistors of said fourth inverter stage forming the output of said second amplifier-inverter delivering said second logic signal of amplified intermediate amplitude, and a feedback circuit formed by first and second feedback N MOS transistors each connected in parallel with the N MOS transistor of said second and third inverter stages, respectively, the gate of said feedback transistors being connected to the output of said second amplifier-inverter.

4. Device according to claim 1, wherein said shaping circuit comprises an inverter stage formed by a P MOS transistor and a N MOS transistors connected in series, the gates of said P MOS and N MOS transistors forming the input of said shaping circuit being connected at the output of said second amplifier-inverter, and the common point of said P MOS and N MOS transistors forming the output of said shaping circuit delivering said second inverted logic signal at the TTL level.

5. Device according to claim 1, wherein said power inverter-amplifier circuit comprises an inverter stage formed by a P MOS transistor and a N MOS transistors connected in series, the gate of said P MOS and N MOS transistors forming the input of said power inverter-amplifier circuit being connected at the output of said shaping circuit and the common point of the two P MOS and N MOS transistors forming an output of said inverter-amplifier circuit delivering said amplified logic signal at the TTL level.

6. Device according to claim 1, wherein said control circuit comprises: first, second, third and fourth inverter stages, each formed by a P MOS transistor and a N MOS transistor in series, said inverter stages being connected in parallel between the power supply voltage and the reference voltage, the common point of said P MOS and N MOS transistors being connected to the gates of the P MOS and N MOS transistors of the following inverter stage, the common point of the P MOS and N MOS transistors of the fourth inverter stage forming an output of the control circuit and being connected to the gate of said P MOS power transistor of said first amplifier-inverter and to the respective gate of first and second inhibitor N MOS transistors connected in parallel between the gate and reference voltage of said feedback transistors of the second amplifier-inverter or between the gate and reference voltage of the N MOS transistor of said second and third inverter stages of said second amplifier-inverter, respectively.

7. A device for interfacing logic signals from the LLL level to the TTL and CMOS level, said device comprising, fed by a power supply voltage at the TTL level with respect to a reference voltage, and connected in series;
  a first amplifier-inverter, receiving said logic signal at the LLL level on one input, and delivering a first inverted logic signal, of intermediate amplitude,
  a second amplifier-inverter, receiving said first inverted logic signal of intermediate amplitude and delivering a second logic signal of amplified intermediate amplitude,
  a shaping circuit, receiving said second logic signal of amplified intermediate amplitude and delivering an inverted logic signal at the TTL level, and
  a power inverter-amplifier circuit receiving said inverted logic signal at the TTL level and delivering an amplified logic signal at the TTL level, said first amplifier-inverter comprising:
    a first inverter stage formed by a P MOS transistor and a N MOS transistor connected in series, the gate of said P MOS transistor forming the input of said interfacing device and receiving said logic signal at the LLL level,
    a second inverter stage formed by a P MOS transistor and a N MOS transistor connected in series, said first and said second inverter stages being connected in parallel between said reference voltage and a common point,
    a P MOS power transistor interconnected between said power supply voltage and said common point,
    a third inverter stage formed by a P MOS transistor and a N MOS transistor connected in series between said power supply voltage and said reference voltage, the common point between the P MOS and transistors of said third inverter stage forming the output terminal of said first amplifier-inverter and delivering said first inverted logic signal of intermediate amplitude, and
    a feedback circuit formed by first and second feedback N MOS transistors each connected in parallel with the N MOS transistor of the first and second inverter stages, respectively, the gates of said feedback transistors being connected at the output of said first amplifier-inverter.

8. A device for interfacing logic signals from the LLL level to the TTL and CMOS level, said device comprising, fed by a power supply voltage at the TTL level with respect to a reference voltage, and connected in series;
  a first amplifier-inverter, receiving said logic signal at the LLL level on one input, and delivering a first inverted logic signal, of intermediate amplitude,
  a second amplifier-inverter, receiving said first inverted logic signal of intermediate amplitude and delivering a second logic signal of amplified intermediate amplitude,
  a shaping circuit, receiving said second logic signal of amplified intermediate amplitude and delivering an inverted logic signal at the TTL level, and
  a power inverter-amplifier circuit receiving said inverted logic signal at the TTL level and delivering an amplified logic signal at the TTL level, said second amplifier-inverter comprising:
    first, second, third, fourth and fifth inverter stages, each formed by a P MOS transistor and a N MOS transistor connected in series, said inverter stages being connected in parallel between said power supply voltage and said reference voltage, the gate of the P MOS transistor of the first inverter stage being connected to the common point of the P MOS and N MOS transistors of said first inverter stage and the gate of the N MOS transistor of said first inverter stage being connected to the common point of said first inverter stage of said first amplifier-inverter, and the output of the said first amplifier-inverter being connected to the gate of the P MOS transistor of said second inverter stage, to from the interconnection between the output of said first amplifier-inverter and the input of said second amplifier-inverter, the common point between the P MOS transistor and the N MOS transistor of said second inverter stage being connected to the gate of the N MOS transistor of said fourth inverter stage, and the gate of the P MOS transistors of said third and fourth and fifth inverter stages being interconnected to the common point of said third inverter and of said fifth inverter stage, respectively, the common point of the P MOS and N MOS transistors of said fourth inverter stage forming the output of said second amplifier-inverter delivering said second logic signal of amplified intermediate amplitude, and
    a feedback circuit formed by first and second feedback N MOS transistors each connected in parallel with the N MOS transistor of said second and third inverter stages, respectively, the gate of said feedback transistors being connected to the output of said second amplifier-inverter.

* * * * *